(12) United States Patent
Kim

(10) Patent No.: US 7,237,587 B2
(45) Date of Patent: Jul. 3, 2007

(54) MULTI-LAYER PRINTED CIRCUIT BOARD

(75) Inventor: Sung-ki Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/244,333

(22) Filed: Oct. 6, 2005

(65) Prior Publication Data

US 2006/0076668 A1     Apr. 13, 2006

(30) Foreign Application Priority Data

Oct. 7, 2004    (KR) ...................... 10-2004-0079983

(51) Int. Cl.
*H01K 1/03*    (2006.01)
(52) U.S. Cl. ...................... 147/255; 174/250; 257/700; 257/691; 361/748
(58) Field of Classification Search ...................... None
See application file for complete search history.

(56) References Cited

U.S. PATENT DOCUMENTS 5,946,557 A * 8/1999 Hosoda et al. .............. 438/128
6,172,305 B1 * 1/2001 Tanahashi .................... 174/255
6,326,557 B1   12/2001 Cheng
6,384,340 B1    5/2002 Cheng

FOREIGN PATENT DOCUMENTS

| JP | 1994-06-177548 | 6/1994 |
| JP | 2002-299815 | 10/2002 |

* cited by examiner

*Primary Examiner*—Leonardo Andujar
(74) *Attorney, Agent, or Firm*—Stanzione & Kim, LLP

(57) ABSTRACT

A multi-layer PCB includes a first signal layer, a ground layer, a second signal layer, a third signal layer, an electric power layer, and a fourth signal layer, including a first insulating layer arranged between the first signal layer and the ground layer; a second insulating layer arranged between the ground layer and the second signal layer; a third insulating layer arranged between the second signal layer and the third signal layer; a fourth insulating layer arranged between the third signal layer and the electric power layer; and a fifth insulating layer arranged between the electric power layer and the fourth signal layer, wherein at least one of the first signal layer, the second signal layer, the third signal layer, and the fourth signal layer includes a pattern.

17 Claims, 3 Drawing Sheets

FIG. 2

| LAYER | THICKNESS(mm) | TICKNESS(mils) |
|---|---|---|
| FIRST SIGNAL LAYER | 0.05 | 1.97 |
| FIRST INSULATING LAYER | 0.10 | 3.94 |
| GROUND LAYER | 0.035 | 1.38 |
| SECOND INSULATING LAYER | 0.15 | 5.91 |
| SECOND SIGNAL LAYER | 0.035 | 1.38 |
| THIRD INSULATING LAYER | 0.8 | 31.5 |
| THIRD SIGNAL LAYER | 0.035 | 1.38 |
| FOURTH INSULATING LAYER | 0.15 | 5.91 |
| ELECTRIC POWER LAYER | 0.035 | 1.38 |
| FIFTH INSULATING LAYER | 0.10 | 3.94 |
| FIFTH SIGNAL LAYER | 0.05 | 1.97 |
| PCB TOTAL THICKNESS | 1.54 | 60.66 |

MULTI-LAYER PRINTED CIRCUIT BOARD

CROSS-REFERENCE TO RELATED APPLICATION

This application claims priority to and the benefit of Korean Patent Application No. 10-2004-0079983, filed on Oct. 7, 2004, which is hereby incorporated by reference for all purposes as if fully set forth herein.

BACKGROUND OF THE INVENTION

1. Field of the Invention

The present invention relates to a multi-layer printed circuit board, and more particularly, to a multi-layer printed circuit board having improved electrical properties.

2. Description of the Related Art

A PCB (printed circuit board) generally includes 6 signal layers and insulating layers respectively arranged between the signal layers.

Electrical properties of the multi-layer printed circuit board include impedance matching, EMI (electro-magnetic interference), cross-talk, ringing, glitch, timing, decrease of SSN (simultaneous switching noise), unwanted coupling, and skew.

The electrical properties change according to a thickness of each of the insulating layers included in the multi-layer PCB, a width of a pattern formed on the signal layer, and an interval between the patterns, and the electrical properties are independent of one another. Therefore, when one of the electric properties is enhanced, another may worsen.

Accordingly, the multi-layer PCB needs to be configured to satisfy the aforementioned electric properties by optimizing the thickness of the insulating layer comprised in the multi-layer PCB, the width of the pattern formed on the signal layer, and the interval between the patterns which influence the electric properties.

SUMMARY OF THE INVENTION

The present invention provides a multi-layer PCB where various electric properties are simultaneously enhanced.

Additional features of the invention will be set forth in the description which follows, and in part will be apparent from the description, or may be learned by practice of the invention.

The present invention discloses a printed circuit board (PCB) including a first signal layer, a ground layer, a second signal layer, a third signal layer, an electric power layer, and a fourth signal layer, including: a first insulating layer arranged between the first signal layer and the ground layer; a second insulating layer arranged between the ground layer and the second signal layer; a third insulating layer arranged between the second signal layer and the third signal layer; a fourth insulating layer arranged between the third signal layer and the electric power layer; and a fifth insulating layer arranged between the electric power layer and the fourth signal layer, wherein at least one of the first signal layer, the second signal layer, the third signal layer, and the fourth signal layer includes a pattern.

The present invention also discloses a PCB, including: a plurality of signal line layers; and an insulating region arranged between each of the signal line layers; wherein a thickness of each of the insulating regions decreases from a center insulating region to an outer insulating region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2 is a diagram showing a thickness of each layer of the multi-layer PCB shown in FIG. 1.

DESCRIPTION OF THE ILLUSTRATED EMBODIMENT

Figure 1:
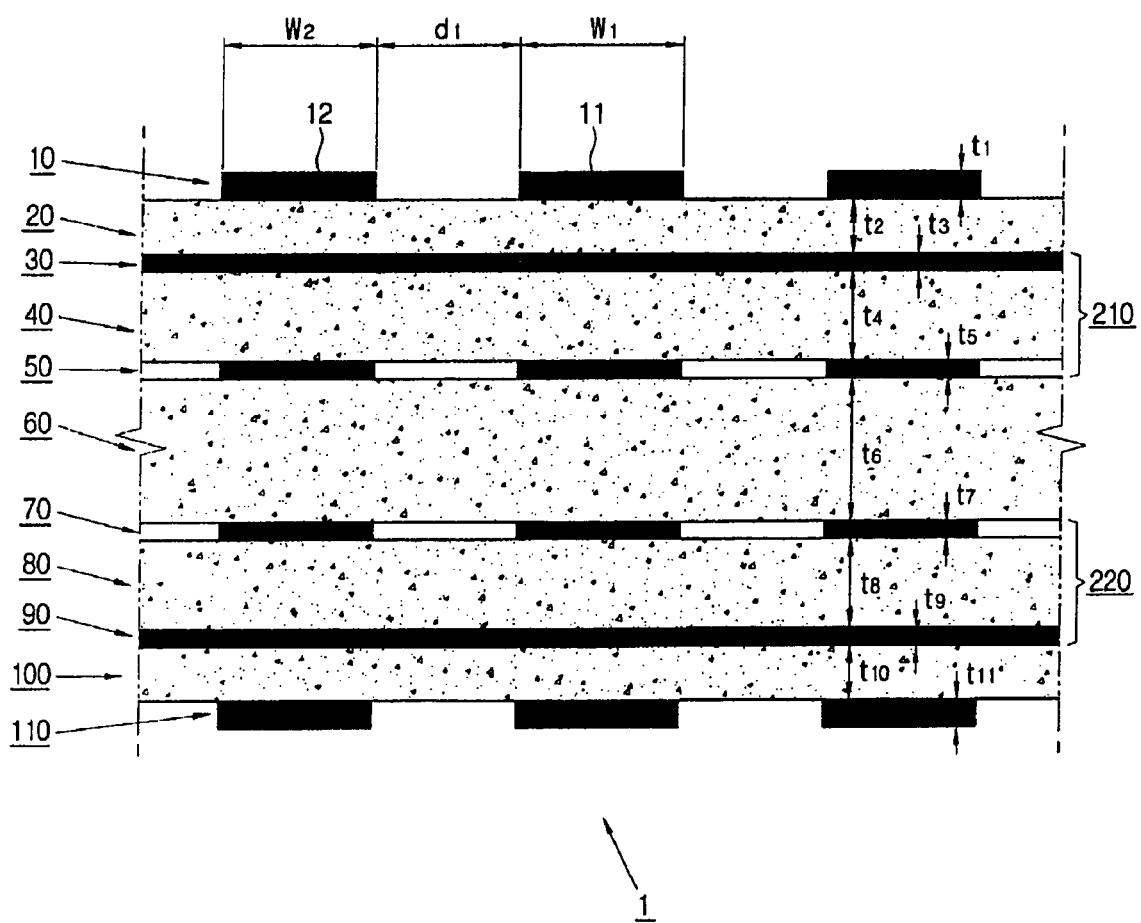
FIG. 1 is a sectional view of a multi-layer PCB according to an embodiment of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

FIG. 1 is a sectional view of a multi-layer PCB according to an embodiment of the invention. A multi-layer PCB 1 includes a first signal layer 10, a first insulating layer 20, a ground layer 30, a second insulating layer 40, a second signal layer 50, a third insulating layer 60, a third signal layer 70, a fourth insulating layer 80, an electric power layer 90, a fifth insulting layer 100, and a fourth signal layer 110, which are sequentially arranged; e.g. stacked on top of each other.

A pattern 11 for a wiring assembly is formed on the first signal layer 10, the second signal layer 50, the third signal layer 70, and the fourth signal layer 110, respectively. Guards 12 are formed on both sides of the pattern 11 are formed guards 12. The guard 12 has a ground property and the pattern 11 arranged between the guards 12 is applied with a clock signal.

The ground layer 30 grounds the patterns 11 formed on the first signal layer 10, the second signal layer 50, the third signal layer 70 and the fourth signal layer 110. The electric power layer 90 applies power to the first signal layer 10, the second signal layer 50, the third signal layer 70, and the fourth signal layer 110.

The first insulating layer 20 is arranged between the first signal layer 10 and the ground layer 30. As shown in FIG. 1, the first signal layer 10 is separated from the ground layer 30 by the thickness t2 of the first insulating layer 20.

The second insulating layer 40 is arranged between the ground layer 30 and the second signal layer 50. As shown in FIG. 1, the ground layer 30 is separated from the second signal layer 50 by the thickness t4 of the second insulating layer 40.

The third insulting layer 60 is arranged between the second signal layer 50 and the third signal layer 70. As shown in FIG. 1, the second signal layer 50 is separated from the third signal layer 70 by the thickness t6 of the third insulating layer 60.

The fourth insulating layer 80 is arranged between the third signal layer 70 and the electric power layer 90. As shown in FIG. 1, the third signal layer 70 is separated from the electric power layer 90 by the thickness t8 of the fourth insulating layer 80.

The fifth insulating layer 100 is arranged between the electric power layer 90 and the fourth signal layer 110. As shown in FIG. 1, the electric power layer 90 is separated from the fourth signal layer 110 by the thickness t10 of the fifth insulating layer.

The first insulating layer 20, the third insulating layer 60, and the fifth insulating layer 100 are formed of a prepreg material, more specifically, of polyester prepreg.

The ground layer 30, the second insulating layer 40, and the second signal layer 50 combine to form a first core 210. The second insulating layer 40 may be formed of a fibrous core material, e.g., acryl glass. The ground layer 30 and the second signal layer 50 may be formed of copper.

The third signal layer 70, the fourth insulating layer 80 and the electric power layer 90 form a second core 220. The fourth insulating layer 80 may be formed of a fibrous core material, e.g., acryl glass. The third signal layer 70 and the electric power layer 90 may be formed of copper.

The first signal layer 10 and the fourth signal layer 110 are exposed to the outside and may be formed of copper.

According to an embodiment of the invention, the thickness t2 of the first insulating layer 20, and the thickness t10 of the fifth insulating layer 100 are each about 0.1 mm. The thicknesses t4 of the second insulating layer 40 and the thickness t8 of the fourth insulating layer 80 are each about 0.15 mm. Thickness t6 of the third insulating layer 60 is about 0.8 mm.

The thickness of each insulating layer may be acceptable with an error range of about 10%. Accordingly, the thickness t2 and t10 may be about 0.1 mm±0.01 mm, respectively; the thickness of t4 and t8 may be about 0.15 mm±0.015 mm, respectively; and the thickness of t6 may be about 0.8 mm±0.08 mm.

FIG. 2 is a diagram showing a thickness of each layer of the multi-layer PCB 1 according to the embodiment of the invention shown in FIG. 1. For example, as shown in FIG. 2, the thicknesses t1, t11 of the first signal layer 10 and the fourth signal layer 110 are 0.05 mm, respectively; the thicknesses t5, t7, t3, t9 of the second signal layer 50, the third signal layer 70, the ground layer 30, and the electric power layer 90 are 0.035 mm, respectively; the thicknesses t2, t10 of the first insulating layer 20 and the fifth insulating layer 100 are 0.1 mm, respectively; the thicknesses t4, t8 of the second insulting layer 40 and the fourth insulating layer 80 are 0.15 mm, respectively; and the thickness t6 of the third insulating layer 60 is 0.8 mm. Accordingly, the thickness of the PCB 1 is 1.54 mm in total.

The thickness of each layer of the PCB may be acceptable within about an error range of 10%. Accordingly, t1 and t11 may be 0.05 mm±0.005 mm, respectively; and t5, t7, t3, and t9 may be 0.035 mm±0.0035 mm.

Therefore, the thickness of the PCB 1 may be acceptable within an error range of about 10%, which may be 1.54 mm± about 0.15 mm.

In the multi-layer PCB 1 shown in FIG. 1, an interval d1 between the pattern 11 and the guard 12 is preferably about 0.1524 mm. Specifically, the interval d1 between the pattern 11 and the guard 12 may be 0.1524 mm± an error range of about 0.015 mm.

The pattern 11 may have a width w1 of about 0.1778 mm. Specifically, the width w1 of the pattern 11 may be 0.1778 mm± an error range of about 0.017 mm.

The guard 12 may have a width w2 of about 0.1524 mm. Specifically, the width w2 of the guard 12 may be 0.1524 mm± and error range of about 0.015 mm, within about 10%.

In the above described embodiment, an electrical resistance of each pattern 11 is about 40Ω~55Ω.

When the thickness of the pattern 11 is increased, the width of the pattern 11 decreases and the interval between the pattern 11 and the guard 12 increase.

Figure 3:
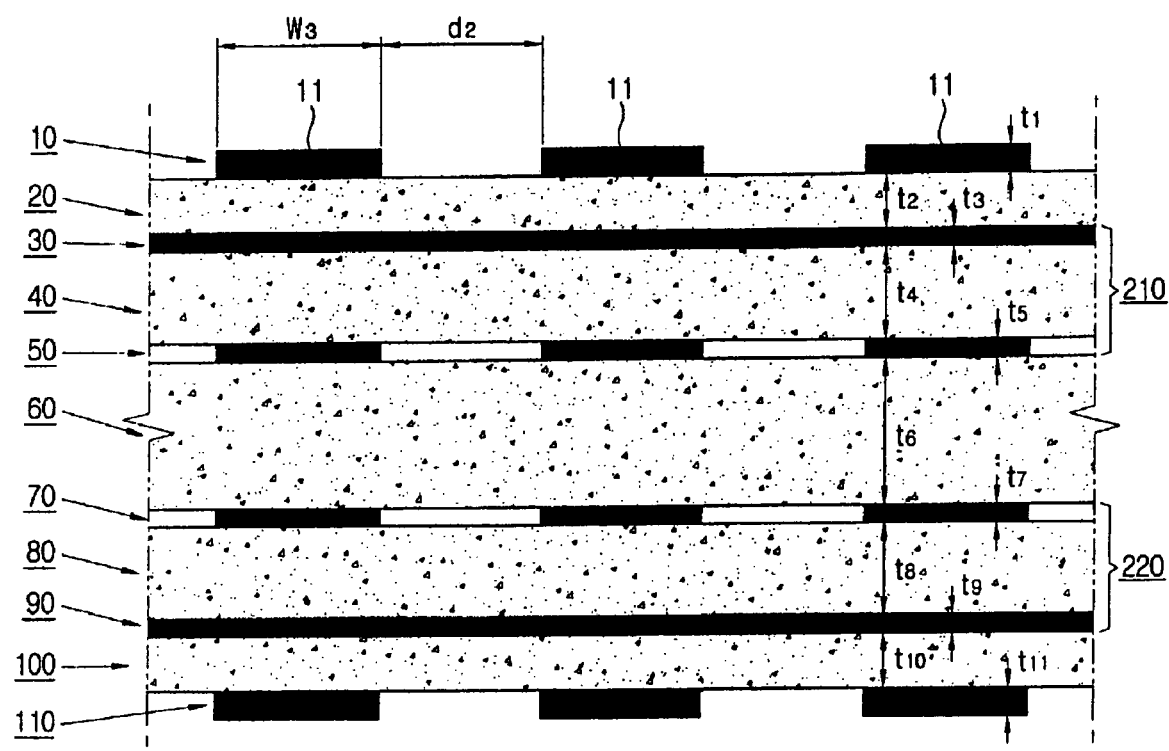
FIG. 3 is a sectional view of a multi-layer PCB according to another embodiment of the invention.

FIG. 3 is a sectional view of a multi-layer PCB according to another embodiment of the invention.

According to an embodiment of the invention, a pattern 11 is formed without a guard on each of the first signal layer 10, the second signal layer 50, the third signal layer 70, and the fourth signal 110 of a multi-layer PCB 1. The pattern 11 may be applied with a data signal.

A width w3 of the pattern 11 is preferably 0.1778 mm. Specifically, the width w3 of the pattern 11 may be 0.1778 mm±0.017 mm, within about 10% of an error range.

An interval d2 between the adjacent patterns 11 is preferably 0.2032 mm. Specifically, the interval d2 between the patterns 11 may be 0.2032 mm±0.02 mm, within about 10% of an error range.

When the pattern is formed through impedance matching on the multi-layer PCB 1 using the above described configuration, there is reduced cross-talk and ringing; glitch is removed; a timing problem is resolved; simultaneous switching noise (SSN) is reduced; and unwanted coupling and skew in the multi-layer PCB 1 is removed, as compared with the conventional multi-layer PCB.

The multi-layer PCB 1 has enhanced electrical properties over the conventional multi-layer PCB, thereby reducing electro-magnetic interference (EMI).

The multi-layer PCB 1 further includes the first insulating layer 20 arranged between the first signal layer 10 and the ground layer 30 and being about 0.1 mm±0.01 mm thick; the second insulating layer 40 arranged between the ground layer 30 and the second signal layer 50 and being about 0.15 mm±0.015 mm thick; the third insulating layer 60 arranged between the second signal layer 50 and the third signal layer 70 and being about 0.8 mm±0.08 mm thick; the fourth insulating layer 80 arranged between the third signal layer 70 and the electric power layer 90 and being about 0.15 mm±0.015 mm thick; and the fifth insulating layer 100 arranged between the electric power layer 90 and the fourth signal layer 110 and being about 0.1 mm±0.01 mm thick, thereby simultaneously enhancing various electric properties of the multi-layer PCB 1.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A printed circuit board (PCB) comprising a first signal layer, a ground layer, a second signal layer, a third signal layer, an electric power layer, and a fourth signal layer, comprising:

a first insulating layer arranged between the first signal layer and the ground layer;

a second insulating layer arranged between the ground layer and the second signal layer;

a third insulating layer arranged between the second signal layer and the third signal layer;

a fourth insulating layer arranged between the third signal layer and the electric power layer; and a fifth insulating layer arranged between the electric power layer and the fourth signal layer;

wherein at least one of the first signal layer, the second signal layer, the third signal layer, and the fourth signal layer includes a pattern and a guard having an interval with the pattern, the interval increasing as a thickness of the pattern increases.

2. The PCB claim 1, wherein a width of the pattern is about 0.1778 mm± about 0.017 mm.

3. The PCB of claim 1, wherein an interval between the patterns is about 0.2032 mm± about 0.02 mm.

4. The PCB of claim 1, wherein an electric resistance of the pattern is about 40Ω~55Ω.

5. The PCB of claim 1, wherein the pattern comprises copper.

6. The PCB of claim 1, wherein the guard is arranged between adjacent patterns.

7. The PCB of claim 6, wherein an interval between the pattern and the guard is about 0.1524 mm± about 0.015 mm.

8. The PCB of claim 6, wherein a width of the guard is about 0.1524 mm± about 0.015 mm.

9. The PCB of claim 1, wherein the multi-layer PCB is about 1.54 mm± about 0.15 mm thick.

10. The PCB of claim 1, wherein thickness of the first signal layer and the fourth signal layer are about 0.05 mm± about 0.005 mm thick, respectively.

11. The PCB of claim 1, wherein the second signal layer, the third signal layer, the ground layer, and the electric power layer are about 0.035 mm± about 0.003 mm thick, respectively.

12. The PCB of claim 1, wherein the first insulating layer, the second insulating layer, the third insulating layer, the fourth insulating layer, and the fifth insulating layer are about 0.1 mm±0.01 mm thick, about 0.15 mm±0.015 mm thick, about 0.8 mm±0.08 mm thick, about 0.15 mm±0.015 mm thick, and about 0.1 mm±0.01 mm thick, respectively.

13. The PCB of claim 1, wherein at least one of the first insulating layer, the third insulating layer, and the fifth insulating layer comprises a prepreg material.

14. The PCB of clam 1, wherein at least of one of the second insulating layer and the forth insulting compromises a fibrous core material.

15. A printed circuit board (PCB), comprising:

a plurality of layers comprising a plurality of signal line layers, and a plurality of insulating regions arranged between each of the signal line layers, respectively;

wherein a thickness of each of the insulating regions decreases from a center insulating region to an outer insulating; and wherein at least one of the layers comprises a signal pattern and a guard, and an interval between the pattern and the guard is changed according to a thickness of the signal pattern.

16. The PCB of claim 15, wherein the signal pattern being about 0.1778 mm± about 0.017 mm wide and has an electric resistance of about 40Ω~55Ω.0.

17. The PCB of claim 15, wherein the top insulating layer is about 0.1 mm±0.01 mm thick, an insulating layer between the top insulating layer and the center insulating layer is about 0.15 mm±0.015 mm thick, the center insulating layer is about 0.8 mm±0.08 mm thick, an insulating layer between the center insulating layer and the bottom insulating layer is about 0.15 mm±0.015 mm thick, and the bottom insulating layer is about 0.1 mm±0.01 mm thick.

* * * * *